United States Patent
Kim et al.

(10) Patent No.: US 10,433,445 B2
(45) Date of Patent: Oct. 1, 2019

(54) DISPLAY DEVICE

(71) Applicant: LG DISPLAY CO., LTD., Seoul (KR)

(72) Inventors: Donghoon Kim, Seoul (KR); WonSeok Choi, Gyeonggi-do (KR); Moonyoung Shin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/464,728

(22) Filed: Mar. 21, 2017

(65) Prior Publication Data

US 2018/0035559 A1 Feb. 1, 2018

(30) Foreign Application Priority Data

Jul. 28, 2016 (KR) .................. 10-2016-0096330

(51) Int. Cl.
| | |
|---|---|
| *H05K 5/03* | (2006.01) |
| *F16M 11/14* | (2006.01) |
| *F16M 13/02* | (2006.01) |
| *H05K 5/00* | (2006.01) |
| *G06F 1/16* | (2006.01) |
| *G09F 19/22* | (2006.01) |
| *G02F 1/1333* | (2006.01) |
| *H04N 5/655* | (2006.01) |

(52) U.S. Cl.
CPC .............. *H05K 5/03* (2013.01); *F16M 11/14* (2013.01); *F16M 13/02* (2013.01); *G06F 1/1601* (2013.01); *G09F 19/22* (2013.01); *H05K 5/0017* (2013.01); *G02F 1/133308* (2013.01); *G06F 2200/1612* (2013.01); *H04N 5/655* (2013.01)

(58) Field of Classification Search
CPC ...... H05K 5/03; H05K 7/1474; H05K 5/0017; G09F 19/22; F16M 11/14; F16M 13/02; H04N 5/655; G02F 1/133308; H02B 1/40; G06F 1/1624; G06F 1/1601; G06F 2200/1612; H01L 2224/75754; H01L 2224/80139; H01L 2224/80136; H01L 2224/83

USPC .............. 361/724, 725, 726, 727, 807, 809
See application file for complete search history.

(56) References Cited

U.S. PATENT DOCUMENTS 7,793,472 B2* 9/2010 Dries .................. E06B 1/603
 52/214
9,913,015 B2* 3/2018 Engle .................. H04N 5/64
(Continued)

FOREIGN PATENT DOCUMENTS

| CN | 101919240 A | 12/2010 |
| CN | 202972430 U | 6/2013 |

(Continued)

OTHER PUBLICATIONS

Office Action issued in corresponding Chinese Patent Application No. 201710317849.5 dated Apr. 28, 2019.

*Primary Examiner* — Anatoly Vortman
*Assistant Examiner* — Stephen S Sul
(74) *Attorney, Agent, or Firm* — Morgan, Lewis & Bockius LLP

(57) ABSTRACT

A display device is provided. When the display device is attached to a wall, a space between the display device and the wall is not exposed externally, thereby improving the aesthetic quality of the design. The angle of attachment of the display device is simply adjustable, thereby improving user convenience.

15 Claims, 8 Drawing Sheets

(56) References Cited

U.S. PATENT DOCUMENTS

| | | | |
|---|---|---|---|
| 2008/0083865 A1* | 4/2008 | Matsui | F16M 11/10 |
| | | | 248/496 |
| 2010/0271798 A1 | 10/2010 | Yeo et al. | |
| 2012/0049024 A1* | 3/2012 | Smith | F16M 11/041 |
| | | | 248/222.14 |
| 2012/0050639 A1* | 3/2012 | Kim | G02F 1/133308 |
| | | | 349/58 |
| 2013/0135839 A1* | 5/2013 | Sawada | H04M 1/0237 |
| | | | 361/810 |
| 2015/0168995 A1* | 6/2015 | Jeon | G06F 1/1637 |
| | | | 361/679.22 |
| 2016/0041420 A1* | 2/2016 | Takase | G02F 1/133308 |
| | | | 361/724 |
| 2016/0186944 A1 | 6/2016 | Park et al. | |
| 2016/0216737 A1* | 7/2016 | Hayk | G06F 1/1652 |
| 2016/0353593 A1* | 12/2016 | Park | F16M 11/041 |
| 2017/0261154 A1* | 9/2017 | Feldman | F16M 13/02 |

FOREIGN PATENT DOCUMENTS

| | | |
|---|---|---|
| CN | 203243437 U | 10/2013 |
| CN | 105739169 A | 7/2016 |
| JP | 2001309276 A | 11/2001 |
| JP | 2006227077 A | 8/2006 |
| KR | 10-2010-0047751 A | 5/2010 |

* cited by examiner

DISPLAY DEVICE

CROSS REFERENCE TO RELATED APPLICATION

This application claims priority from Korean Patent Application No. 10-2016-0096330 filed on Jul. 28, 2016, which is hereby incorporated by reference for all purposes as if fully set forth herein.

BACKGROUND

Field

The present disclosure relates to a display device. More particularly, the present disclosure relates to a display device that can be attached to a wall, such that a space between the display device and the wall is not exposed externally, thereby improving a sense of unity between the wall and the display device, as well as the aesthetic quality of the design, and such that the angle of attachment of the display device is simply adjustable, thereby improving user convenience.

Description of Related Art

Generally, research into flat panel display devices, such as liquid crystal display (LCD) devices, plasma display devices, field emission display (FED) devices, and organic light-emitting display devices, has been actively undertaken. In this regard, LCD devices and organic light-emitting display devices have come to prominence through allowing for mass production, having ease of driving, as well as the realization of high definition.

FIG. 1 is a side elevation view illustrating a related-art display device attached to a wall.

In the related art, as illustrated in FIG. 1, a wall attachment device 20 is attached to a wall 30, and a wall display device 10 is connected to the wall attachment device 20 using a holder, or the like, provided on the rear surface thereof, such that the wall display device 10 can be attached to the wall 30.

However, it may be difficult for a user to attach the related-art wall attachment device 20 for the display device 10 to the wall by him or herself, since the wall attachment device 20 may be relatively large and heavy. In addition, the large size and heavy weight of the wall attachment device 20 may lead to an increase in manufacturing costs, thereby increasing a retail price, which is problematic.

In addition, in the related-art wall attachment device, a space between the rear surface of the display device and the wall is exposed externally, such that the display device is observed to protrude or to be spaced apart from the wall by the size of the wall attachment device. This may consequently cause users to feel that the display device is thick, thereby degrading the aesthetic quality of the design.

Furthermore, in the display device of the related art as described above, the space formed between the rear surface of the display device and the wall is externally exposed, thereby degrading the aesthetic appeal. In addition, dust or impurities may enter the rear space, making it difficult to keep the area surrounding the display device clean.

SUMMARY

Accordingly, the present invention is directed to a display device that substantially obviates one or more of the problems due to limitations and disadvantages of the related art.

Various aspects of the present disclosure provide a display device, and more particularly, a thin, slim organic light-emitting display device that can be attached to a wall such that a space between the display device and the wall is not exposed externally, thereby improving a sense of unity between the wall and the display device, as well as the aesthetic quality of the design, which are important aesthetic factors to users.

Also provided is a display device that allows the angle of the display device attached to the wall to be easily adjusted. This can consequently prevent dust or impurities from entering a space between the rear surface of the display device and the wall, thereby improving user convenience and making it easy to keep the area surrounding the display device clean.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

According to exemplary embodiments of the present disclosure, provided is a display device having a structure allowing a middle cabinet and a cabinet cover to slide in the front and rear direction. A space between the display device and a wall is not exposed externally, thereby improving a sense of unity between the wall and the display device.

According to exemplary embodiments, the first fixing member of the back cover may have a spherical ball portion protruding in a direction of the rear surface of the back cover. The second fixing member located on the wall may have a fixing portion fixed to the wall, a cylinder portion extending from the fixing portion, and a housing portion disposed at a distal end of the cylinder portion to surround the ball portion, thereby supporting tilting movements. This configuration allows a user to easily adjust the angle of the display device attached to the wall as required.

According to exemplary embodiments, a display device, and more particularly, a thin, slim organic light-emitting display device can be attached to a wall such that a space between the display device and the wall is not exposed externally, thereby improving a sense of unity between the wall and the display device, as well as the aesthetic quality of the design, which are important aesthetic factors to users.

In addition, according to exemplary embodiments, the angle of a display device attached to the wall can be easily adjusted. This can consequently prevent dust or impurities from entering a space between the rear surface of the display device and the wall, thereby improving user convenience and making it easy to keep the area surrounding the display device clean.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
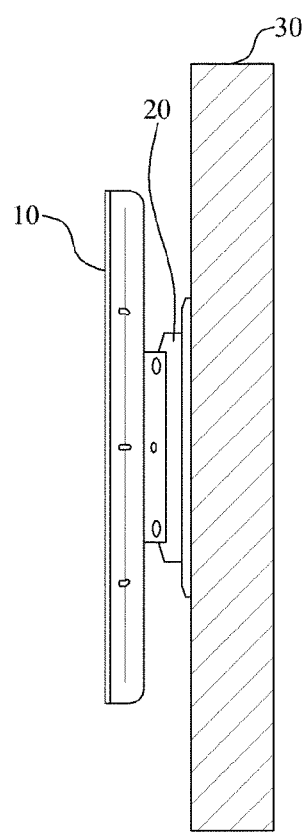
FIG. 1 is a side elevation view illustrating a related-art display device attached to a wall.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

Figure 2:
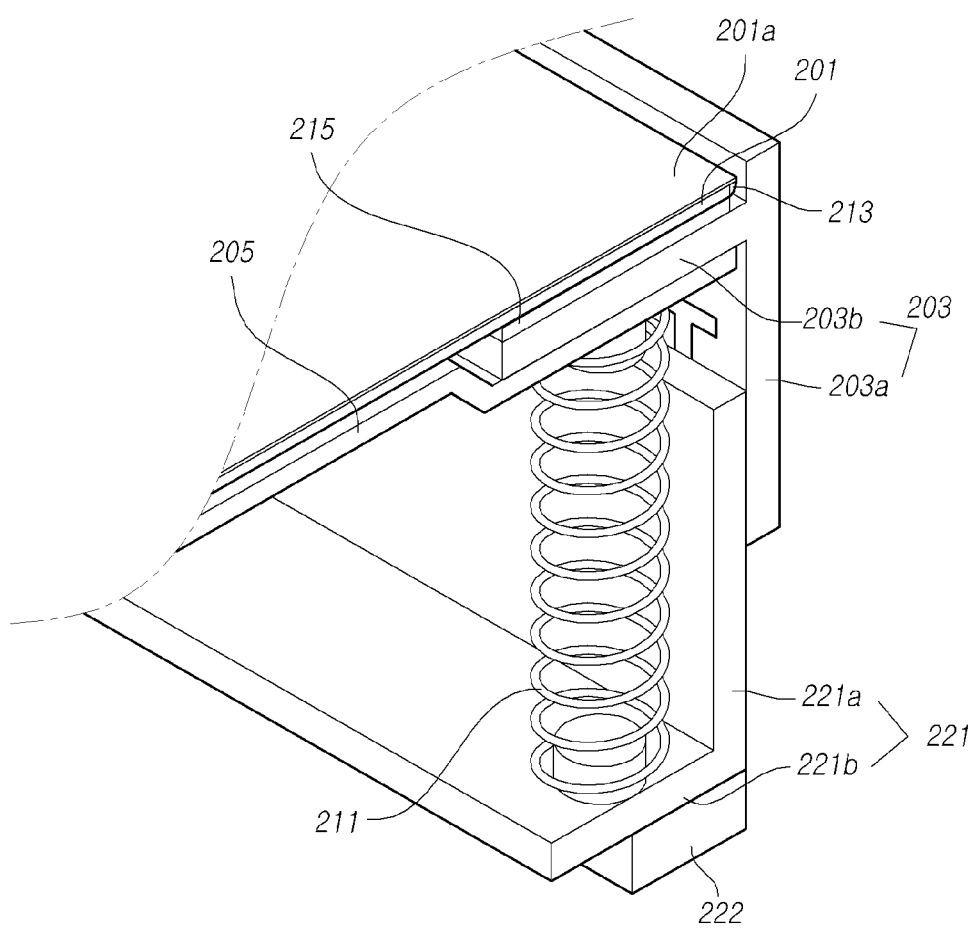
FIG. 2 is a perspective view illustrating portions of a display device according to exemplary embodiments.
Figure 3:
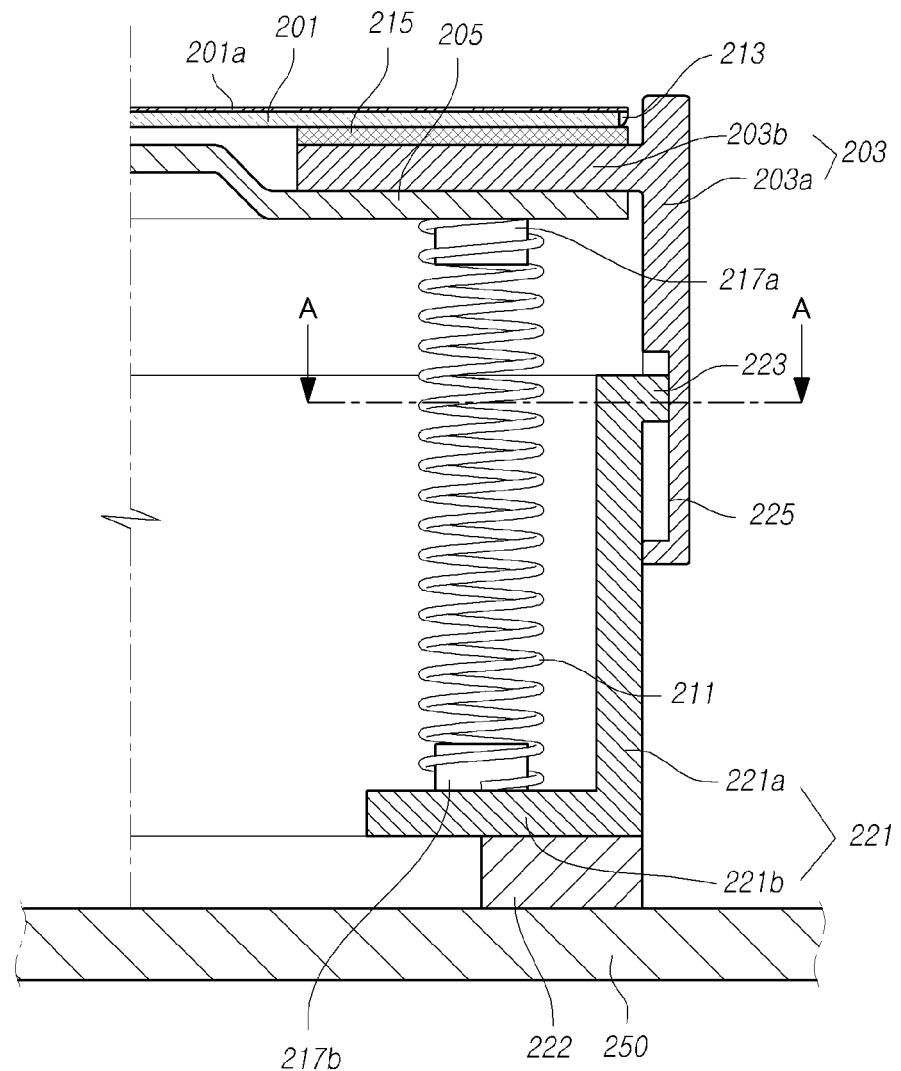
FIG. 3 is a cross-sectional view illustrating the portions of the display device according to exemplary embodiments.
Figure 4:
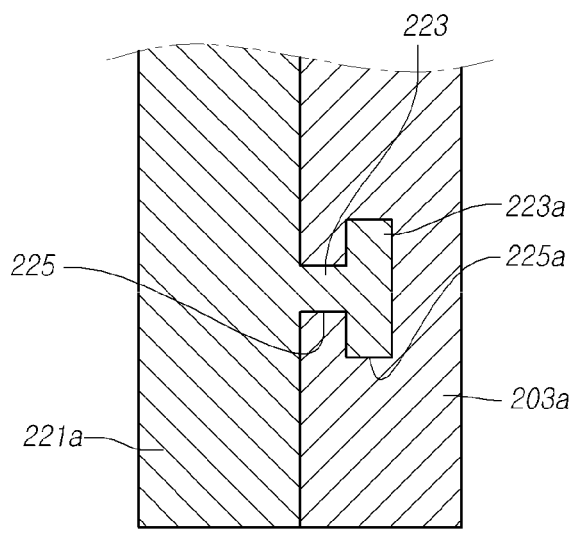
FIG. 4 is a cross-sectional view taken along line A-A in FIG. 3.
Figure 5:
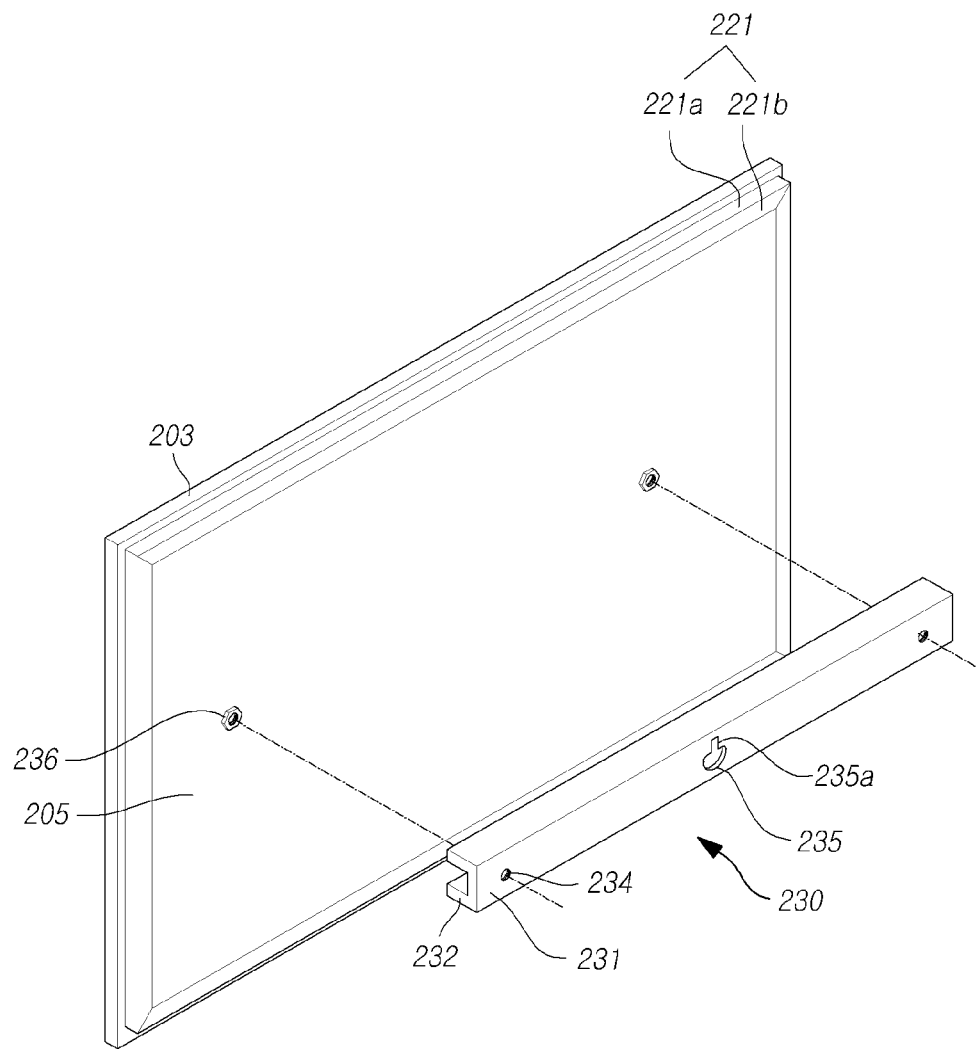
FIG. 5 is an exploded perspective view illustrating the rear side of the display device according to exemplary embodiments.
Figure 6:
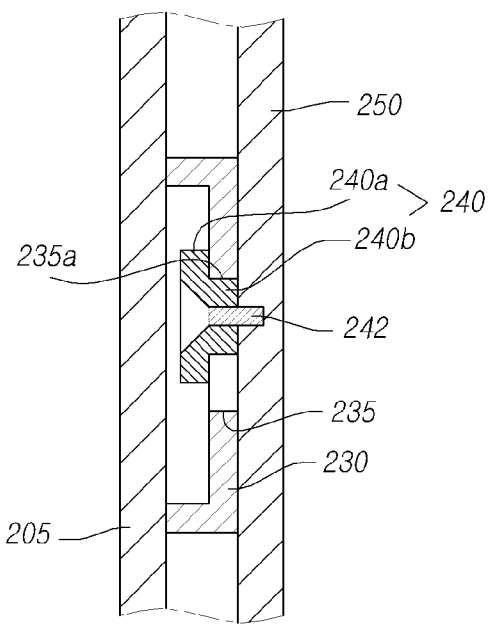
FIG. 6 is a cross-sectional view illustrating portions of FIG. 5.
Figure 7:
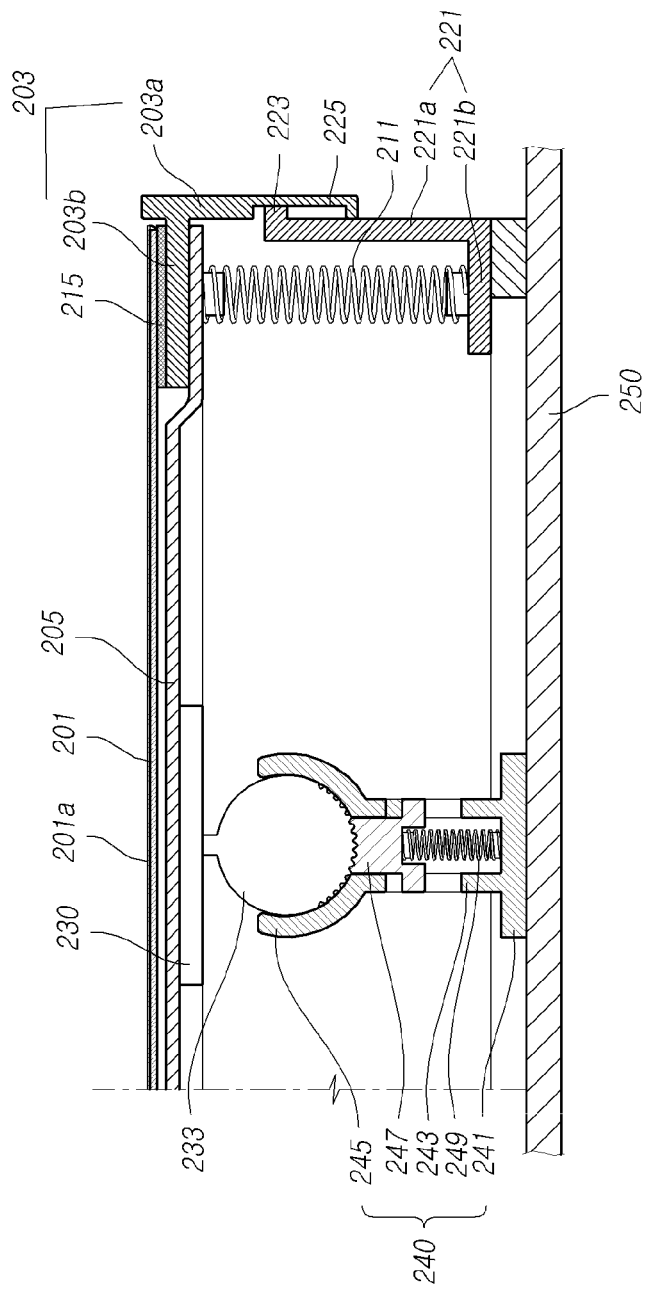
FIG. 7 is a cross-sectional view illustrating the display device according to exemplary embodiments attached to a wall.
Figure 8:
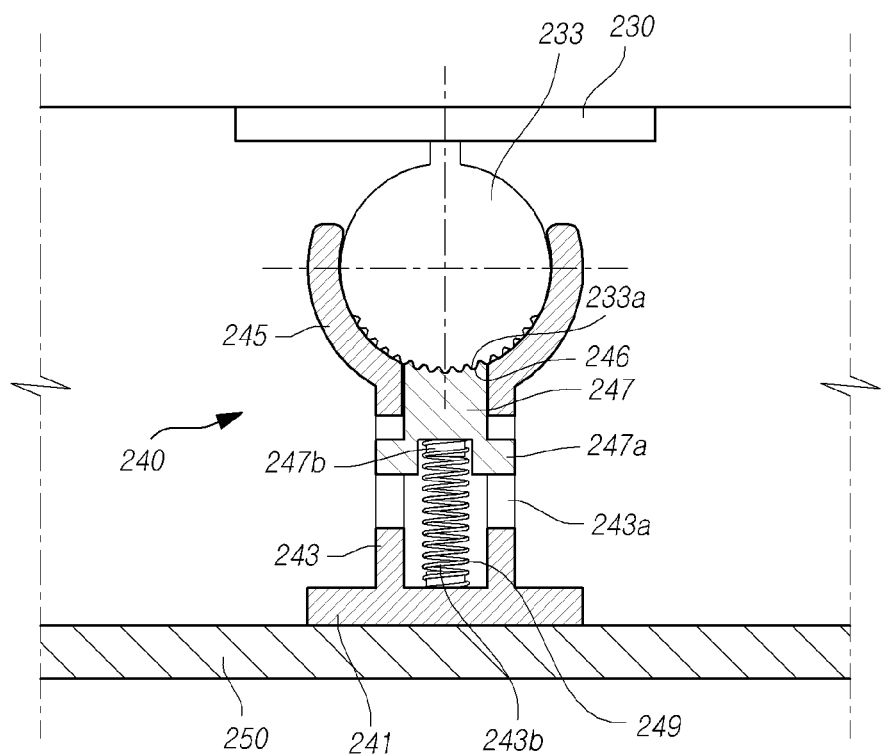
FIG. 8 is an enlarged view illustrating portions of FIG. 7.

FIG. 2 is a perspective view illustrating portions of a display device according to exemplary embodiments, FIG. 3 is a cross-sectional view illustrating the portions of the display device according to exemplary embodiments, FIG. 4 is a cross-sectional view taken along line A-A in FIG. 3, FIG. 5 is an exploded perspective view illustrating the rear side of the display device according to exemplary embodiments, FIG. 6 is a cross-sectional view illustrating portions of FIG. 5, FIG. 7 is a cross-sectional view illustrating the display device according to exemplary embodiments attached to a wall, and FIG. 8 is an enlarged view illustrating portions of FIG. 7.

Referring to FIG. 2, the display device according to exemplary embodiments includes a middle cabinet 203, a back cover 205, and cabinet cover 221. The middle cabinet 203 has a first support portion 203a surrounding one edge of a display panel 201 and a second support portion 203b extending inward from the inner surface of the first support portion 203a. The rear surface of the display panel 201 is seated on the front surface of the second support portion 203b. The back cover 205 is disposed on the rear surface of the second support portion 203b. The cabinet cover 221 is supported on the inner surface or the outer surface of the first support portion 203a. The cabinet cover 221 is configured to slide in the direction of the front surface of the display panel 201 or in the opposite direction and to be in close contact with a wall 250.

Due to the structure of the display device according to exemplary embodiments, the middle cabinet 203 and the cabinet cover 221 can slide. When a display device, in particular, a thin, slim organic light-emitting display device is attached to the wall 250, a space between the display device and the wall 250 is not exposed externally. This can consequently improve a sense of unity between the display device and the wall 250, as well as the aesthetic quality of the design of the display device, which are important aesthetic factors to users.

The display panel 201 according to exemplary embodiments may be implemented as a liquid crystal display (LCD) panel or an organic light-emitting display panel. The organic light-emitting display panel may be comprised of a bottom substrate, including a number of light-emitting cells provided in areas defined by gate lines, data lines, and power (VDD) lines, and a top substrate joined to the bottom substrate while facing the bottom substrate.

In addition, each of the number of light-emitting cells provided on the bottom substrate includes at least one switching transistor, at least one driving transistor, and an organic light-emitting device. The switching transistor is connected to a gate line and a data line corresponding thereto. The driving transistor is connected to the switching transistor and a power line corresponding thereto. The organic light-emitting device, such as an organic light-emitting diode (OLED), emits light in response to current controlled by switching of the driving transistor. The top substrate may include a moisture absorbing material or the like that protects the organic light-emitting device from moisture or oxygen in the air.

The top substrate may further include an organic light-emitting device connected to the driving transistor. In this case, the organic light-emitting device may be omitted from the bottom substrate.

According to the present disclosure, the display panel 201 is seated on the front surface of the second support portion 203b of the middle cabinet 203. In the case of an organic light-emitting display, a backlight unit for emitting light toward the display panel is not provided, due to the structure of the organic light-emitting display that emits light by itself. A bonding pad 215 is disposed between the display panel 201 and the second support portion 203b.

On the other hand, an LCD panel may include a backlight unit, a driver circuit unit, and casing members by which the LCD panel, the backlight unit, and the like are fitted together. The driver circuit unit may include a data driver circuit (or a source driver circuit), a gate driver circuit (or a scanning driver circuit), a timing controller, a printed circuit board (PCB), and the like.

In addition, in the LCD panel, a liquid crystal layer may be located between the top substrate and the bottom substrate. The top substrate may be a color filter substrate, while the bottom substrate may be a thin-film transistor (TFT) substrate.

In the case of the organic light-emitting display panel, organic compounds in a pixel array may be degraded when exposed to moisture or oxygen. An encapsulation member (not shown) may be bonded to the rear surface of the display panel to seal the pixel array in order to prevent the problem of degrading pixels.

When the display panel 201 according to exemplary embodiments is an organic light-emitting display panel, the encapsulation member bonded to the rear surface of the display panel 201 may be implemented as a metal substrate or a glass substrate. In addition, a polarizer plate 201a is bonded to the front surface of the display panel 201.

In addition, a side seal member 213 is provided on the side surface of the display panel 201 to prevent light leakage, i.e. a phenomenon in which light generated by the pixel array leaks through the side surface.

The side seal member 213 may be made of a curable resin to which black pigment is added. The side seal member 213 prevents light from leaking through the side surface of the display panel 201 by absorbing light emitted from the pixel array.

In addition, a plurality of flexible circuit films (not shown) respectively having an integrated circuit (IC, not shown) mounted thereon are electrically connected to the rear surface of one end of the display panel 201 that is rectangular shaped, and a PCB is disposed parallel to the display panel 201.

Each of the plurality of flexible circuit films is attached to a pad and the PCB by tape automated bonding (TAB). The flexible circuit film may be implemented as a tape carrier package (TCP) or a chip-on-flexible board or chip-on-film (COF).

Thus, the display panel 201 is electrically connected to the PCB via the plurality of flexible circuit films, and the PCB electrically connected to the plurality of flexible circuit films provides a variety of signals to display images on the display panel 201.

According to exemplary embodiments, the middle cabinet 203 includes the first support portion 203a and the second support portion 203b perpendicularly connected to the first support portion 203a. The first support portion 203a is provided in the front and rear direction of the display panel 201 while surrounding the edge of the display panel 201, and the second support portion 203b extends inward from the inner surface of the first support portion 203a, such that the rear surface of the display panel 201 is seated on the front surface of the second support portion 203b, and the back cover 205 is seated on the rear surface of the second support portion 203b.

In addition, in the position in which the cabinet cover 221 is supported on the inner surface or the outer surface of the first support portion 203a, the cabinet cover 221 is in close contact with the wall 250 while sliding in the front direction of the display panel 201 or in the opposite direction. Thus, when the display device is attached to the wall 250, the rear structure thereof is not exposed externally, thereby improving the aesthetic quality of the side and preventing dust or impurities from entering the rear space.

As illustrated in FIGS. 5 and 6, a first fixing member 230 provided on the rear surface of the back cover 205 and a second fixing member 240 provided on the wall 250 to support the first fixing member 230, thereby fixing the display device to the wall 250.

The first fixing member 230 has bent portions 232 bent from both longitudinal edges of a body 231 toward the back cover 205 to define a space between the bent portions 232 and the rear surface of the back cover 205, thereby facilitating the fitting of the second fixing member 240. The bent portions 232 bent from the edges can increase the strength of the first fixing member 230 supporting the weight of the display device attached to the wall 250, thereby preventing the first fixing member 230 from being deformed or broken.

Although the first fixing member 230 is illustrated, by way of example, as being coupled to the back cover 205 using fastening members, such as bolts or screws, fitted into PEM® nuts or welded nuts 236 provided on the back cover 205 through fastening holes 234, the present disclosure is not limited thereto. The first fixing member 230 may be integrated with the back cover 205 or may be coupled to the back cover 205 by welding, fusion, bonding, or the like, depending on the material of the back cover 205.

The body 231 of the first fixing member 230 has a fixing hole 235 to support the second fixing member 240 inserted therein. A slot 235a is formed in the upper portion of the fixing hole 235 into which a head 240a of the second fixing member 240 is inserted. Since the width of the slot is smaller than the width of the fixing hole 235, it is easy to fix the second fixing member 240 to the first fixing member 230 by inserting the second fixing member 240 into the fixing hole 235 and then brining down the second fixing member 240 when the display device is attached to the wall 250. Thus, the second fixing member 240 can be simply fitted into the fixing hole 235 without being dislodged therefrom. Accordingly, the second fixing member 240 can be simply fitted into the fixing hole 235 and be prevented from being dislodged therefrom.

That is, the second fixing member 240 includes a body 240b that is fixed to the wall 250 using a fastening member 242, such as a screw, and the head 240a disposed on one end of the body 240b to be inserted into the fixing hole 235. Since the diameter of the body 240b is smaller than the diameter of the head 240a, when the display device is brought down after the head 240a is inserted into the fixing hole 235, the head 240a is supported by the fixing hole 235 without being dislodged therefrom during the movement of the body 240b along the slot 235a.

In addition, the cabinet cover 221 includes a side support portion 221a supported on the inner surface or the outer surface of the first support portion 203a and a wall support portion 221b supported on and in close contact with the wall 250. After the display device is attached to the wall 250 using the first fixing member 230 and the second fixing member 240, the side area of the display device is not exposed externally.

A damper 222 is further provided on the rear surface of the wall support portion 221b to perform damping while making close contact with the wall 250.

As illustrated in FIGS. 3 and 4, in the first support portion 203a of the middle cabinet 203 and the side support portion 221a of the cabinet cover 221, one portion is provided with a guide protrusion 223, and the other portion is provided with a guide groove 225 allowing the guide protrusion 223 inserted therein to slide. This configuration makes it easy to slide and bring the cabinet cover 221 into close contact with the wall 250 after the display device is attached to the wall 250.

As illustrated in FIG. 4, the guide protrusion 223 has fitting protrusions 223a protruding in opposite directions from the guide protrusion 223, and the guide groove 225 has fitting grooves 225a conforming to the fitting protrusions 223a. The fitting protrusions 223a and the fitting grooves 225a configured as described above allow the guide protrusion 223 to smoothly slide in the guide groove 225 without being dislodged from the guide groove 225 when the cabinet cover 221 slides.

Although a pair of fitting protrusions 223a and a pair of fitting grooves 225a are illustrated in FIGS. 3 and 4 as being provided on both sides, the present disclosure is not limited thereto. A single fitting protrusion 223a and a single fitting groove 225a may be provided on one side, or as illustrated in FIG. 4, the pair of fitting protrusions 223a and the pair of fitting grooves 225a may be provided on both sides. Referring to FIGS. 3 and 4, the guide groove 225 is illustrated as being provided in the first support portion 203a, and the guide protrusion 223 is illustrated as being provided on the side support portion 221a. Alternatively, the guide protrusion 223 may be provided on the first support portion 203a, and the guide groove 225 may be provided in the side support portion 221a.

An elastic member 211 is provided between the back cover 205 and the wall support portion 221b to elastically support the cabinet cover 221. With this configuration, when the display device is attached to the wall 250, the cabinet cover 221 can be more easily brought into close contact with the wall 250 by the supporting force of the elastic member 211.

Thus, when the display device is to be attached to the wall 250, a user or a mechanic is only required to couple the first fixing member 230 and the second fixing member 240 by forcing the cabinet cover 221 in the direction of the wall 250. When the first fixing member 230 is coupled to the second fixing member 240, the cabinet cover 221 can slide in the front and rear direction, depending on the amount by which pressing is performed. After the attachment operation is completed, the cabinet cover 221 can be fixed in close contact with the wall 250.

In addition, holding portions 217a and 217b may be provided on one or both of the back cover 205 and the wall support portion 221b. The holding portions 217a and 217b can prevent the elastic member 211 from being dislodged by fixing the elastic member 211 in position. Although the holding portions 217a and 217b are illustrated in FIG. 3 as protrusions, the present disclosure is not limited thereto. The holding portions 217a and 217b may be provided as recesses into which the elastic member 211 can be fixedly inserted.

As illustrated in FIG. 7, the first fixing member 230 is provided with a spherical ball portion 233 protruding in the direction of the rear surface of the back cover 205, such that the display device can tilt or pivot in a predetermined angle on the wall 250.

In addition, the second fixing member 240 includes a fixing portion 241 fixed to the wall 250, a hollow cylinder portion 243 extending from the fixing portion 241, and a housing portion 245 disposed at the distal end of the cylinder portion 243 to surround the ball portion 233, thereby supporting tilting movements.

The fixing portion 241 may be attached to the wall 250 using a fastening member, such as a bolt or a screw, as described above, or may be fixed to the wall 250 using an adhesive or by welding, depending on the material of the fixing portion 241.

Since the ball portion 233 of the first fixing member 230 is supported by the housing portion 245 of the second fixing member 240 such that a tilting movement or a pivoting movement about the center of the ball portion 233 can be performed, the angle of attachment of the display device can be more easily adjusted.

The housing portion 245 is configured to be elastically deformed to surround at least half of the ball portion 233 when the ball portion 233 is inserted therein. The housing portion 245 may be made of an elastic material, such as metal or engineering plastic, to have a predetermined level of strength while being able to be easily elastically deformed.

In addition, a support member 247 is disposed on the cylinder portion 243 to be in close contact with the ball portion 233, such that the support member 247 can hold the ball portion 233 by supporting the ball portion 233 in the rotated position. An elastic support member 249 is provided between the support member 247 and the fixing portion 241 to elastically support the support member 247 toward the ball portion 233, such that the supporting force of the support member 247 can be additionally applied to the ball portion 233.

Specifically, although it is possible to fix the position of the ball portion 233 by supporting the ball portion 233 by the elastic force of the housing portion 245 surrounding the ball portion 233 in the case of adjusting the angle of the display device, the support member 247 provided on the cylinder portion 243 can more firmly support the ball portion 233 by the force of the elastic support member 249. Thus, the force of the housing portion 245 supporting the ball portion 233 can be supplemented.

In addition, the support member 247 has sliding protrusions 247a on the outer surface thereof, while the cylinder portion 243 has sliding grooves 243a allowing the sliding protrusions 247a inserted therein to slide. Thus, the support member 247 can slide in the cylinder portion 243 while being supported by the cylinder portion 243. Since the sliding protrusions 247a inserted into the sliding grooves 243a can slide, the elastic support member 249 can slide and support the ball portion 233 in a correct position without being biased to one side, so that the ball portion 233 can be held in the correct position.

One or more convex support protrusions 233a protrude from one of the outer circumference of the ball portion 233 and the front surface of the support member 247, while one or more support recesses 246 having a concave shape conforming to the convex support protrusions 233a are provided in the other of the outer circumference of the ball portion 233 and the front surface of the support member 247.

In the case of changing the angle of the display device, this configuration can prevent a set angle from being undesirably changed due to the insufficient amount of supporting force between the ball portion 233 and the support member 247.

Specifically, in the position in which the angle of the display device is set after the adjustment thereof was completed, the supporting protrusions 233a remain in the inserted position. In the case of changing the angle of the display device, the ball portion 233 rotates to be inserted into the adjacent support recess 246, such that the angle is adjusted sequentially. Here, the elastic supporting force of the elastic support member 249 is increased by an amount corresponding to the amount by which the support protrusions 233a protrude (or the support recesses 246 are depressed), such that the angle is not undesirably changed after the angle was set.

The support protrusions 233a may be provided as one or more support protrusions 233a, while the support recesses 246 may be a plurality of support recesses 246 arranged at regular distances along the circumferential surface.

As described above, in the cabinet cover 221, the side support portion 221a is supported on the inner surface or the outer surface of the first support portion 203a, and the wall support portion 221b is supported on and in close contact with the wall 250, such that the rear surface of the display device is not exposed externally after the angle thereof is adjusted.

In addition, as illustrated in FIG. 7, in the first support portion 203a of the middle cabinet 203 and the side support portion 221a of the cabinet cover 221, one is provided with the guide protrusion 223, while the other is provided with the guide groove 225 allowing the guide protrusion 223 inserted therein to slide. After the display device is attached to the wall 250, it is easy to slide the cabinet cover 221 into close contact with the wall 250.

Furthermore, as illustrated in FIG. 4, the guide protrusion 223 may have the fitting protrusions 223a protruding from both sides thereof, and the guide groove 225 may have the fitting grooves 225a conforming to the fitting protrusions 223a. Since the fitting protrusions 223a and the fitting grooves 225a are provided as above, the guide protrusion 223 can smoothly slide in the guide groove 225 without being dislodged from the guide groove 225 when the cabinet cover 221 slides.

In addition, the elastic member 211 may be provided between the back cover 205 and the wall support portion 221b to elastically support the cabinet cover 221. Since the elastic member 211 is provided as above, when the display device is attached to the wall 250, it is easy to bring the cabinet cover 221 into close contact with the wall 250.

Furthermore, the holding portions 217a and 217b may be provided on one or both of the back cover 205 and the wall support portion 221b. The provision of the holding portions 217a and 217b can fix the position of the elastic member 211 such that the elastic member 211 is not dislodged.

As set forth above, according to exemplary embodiments, when a display device, and more particularly, a thin, slim organic light-emitting display device is attached to a wall, a space between the rear surface of the display device and the wall is not exposed externally. It is thereby possible to improve a sense of unity between the wall and the display device, as well as the aesthetic quality of the design, which are important aesthetic factors to users.

In addition, according to exemplary embodiments, a user can easily adjust the angle of the display device attached to the wall as required. This can prevent dust or impurities from entering a space between the rear surface of the display device and the wall, thereby improving user convenience and making it easy to keep the area surrounding the display device clean.

It will be apparent to those skilled in the art that various modifications and variations can be made in the [TITLE] of the present invention without departing from the spirit or scope of the invention. Thus, it is intended that the present invention cover the modifications and variations of this invention provided they come within the scope of the appended claims and their equivalents.

What is claimed is:

1. A display device, comprising:
    a middle cabinet comprising:
        a first support portion surrounding one edge of a display panel; and
        a second support portion extending inward from an inner surface of the first support portion, a rear surface of the display panel being seated on a front surface of the second support portion;
    a back cover on a rear surface of the second support portion;
    a cabinet cover supported on the inner surface or an outer surface of the first support portion, the cabinet cover being configured to slide in a direction of a front surface of the display panel or in an opposite direction to be in close contact with a wall; and
    an elastic member between and directly contacting the back cover and the cabinet cover to directly elastically support the cabinet cover via holding portions on the back cover and the cabinet cover.

2. The display device according to claim 1, further comprising:
    a first fixing member on a rear surface of the back cover; and
    a second fixing member on the wall to support the first fixing member.

3. The display device according to claim 2, wherein:
    the first fixing member comprises a spherical ball portion protruding in a direction of the rear surface of the back cover; and
    the second fixing member comprises a fixing portion fixed to the wall, a hollow cylinder portion extending from the fixing portion, and a housing portion at a distal end of the hollow cylinder portion to surround the ball portion, thereby supporting tilting movements.

4. The display device according to claim 3, wherein the second fixing member further comprises:
    a support member on the hollow cylinder portion to be in close contact with the ball portion; and
    an elastic support member between the support member and the fixing portion to elastically support the support member toward the ball portion.

5. The display device according to claim 4, wherein:
    the support member has a sliding protrusion provided on an outer surface thereof to be slide-supported in the hollow cylinder portion; and
    the hollow cylinder portion has a sliding groove allowing the sliding protrusion inserted therein to slide.

6. The display device according to claim 5, wherein:
    one of an outer circumference of the ball portion and a front surface of the support member comprises one or more convex support protrusions; and
    the other of the outer circumference of the ball portion and the front surface of the support member comprises one or more support recesses having a concave shape conforming to the convex support protrusions.

7. The display device according to claim 6, wherein the cabinet cover comprises:
    a side support portion supported on the inner surface or the outer surface of the first support portion; and
    a wall support portion supported on and in close contact with the wall.

8. The display device according to claim 7, wherein:
    one of the first support portion and the side support portion has a guide protrusion; and
    the other of the first support portion and the side support portion has a guide groove allowing the guide protrusion inserted therein to slide.

9. The display device according to claim 8, wherein one or both of the back cover and the wall support portion comprise holding portions preventing the elastic member from being dislodged by fixing the elastic member in position.

10. The display device according to claim 1, wherein the cabinet cover comprises:
    a side support portion supported on the inner surface or the outer surface of the first support portion; and
    a wall support portion supported on and in close contact with the wall.

11. The display device according to claim 10, wherein:
    one of the first support portion and the side support portion has a guide protrusions; and
    the other of the first support portion and the side support portion has a guide groove allowing the guide protrusion inserted therein to slide.

12. The display device according to claim 10, wherein the holding portions prevent the elastic member from being dislodged by fixing the elastic member in position.

13. The display device according to claim 10, wherein the elastic member directly contacts the wall support portion of the cabinet cover.

14. The display device according to claim 1, wherein:
- one of the first support portion and the cabinet cover has a guide protrusion;
- the other of the first support portion and the cabinet cover has a guide groove allowing the guide protrusion inserted therein to slide;
- the guide protrusion has fitting protrusions protruding in opposite directions from the guide protrusion; and
- the guide groove has fitting grooves conforming to the fitting protrusions.

15. The display device according to claim 1, further comprising:
- a bonding pad between the display panel and the second support portion of the middle cabinet; and
- wherein the elastic member is provided where the bonding pad, the second support portion, and the back cover overlap.

* * * * *